United States Patent
Tsuchiya et al.

(10) Patent No.: US 7,034,616 B2
(45) Date of Patent: Apr. 25, 2006

(54) OPERATIONAL AMPLIFICATION CIRCUIT, OVERHEAT DETECTING CIRCUIT AND COMPARISON CIRCUIT

(75) Inventors: Naoya Tsuchiya, Aichi-ken (JP); Hirofumi Abe, Gamagoori (JP); Shoichi Okuda, Aichi-ken (JP)

(73) Assignee: Denso Corporation, Kariya (JP)

( * ) Notice: Subject to any disclaimer, the term of this patent is extended or adjusted under 35 U.S.C. 154(b) by 61 days.

(21) Appl. No.: 10/769,758

(22) Filed: Feb. 3, 2004

(65) Prior Publication Data

US 2004/0155709 A1 Aug. 12, 2004

(30) Foreign Application Priority Data

Feb. 12, 2003 (JP) ............................. 2003-033589
Oct. 31, 2003 (JP) ............................. 2003-373114

(51) Int. Cl.
*H03F 3/45* (2006.01)

(52) U.S. Cl. ...................... 330/255; 330/252; 330/257; 330/262; 330/288; 330/289

(58) Field of Classification Search ................. 330/255
See application file for complete search history.

(56) References Cited

U.S. PATENT DOCUMENTS 4,068,254 A * 1/1978 Erdi ........................... 257/273
4,780,625 A * 10/1988 Zobel ........................... 327/53
6,433,636 B1 * 8/2002 Kasuya et al. ............... 330/255
2001/0009389 A1 * 7/2001 Kasuya et al. ............... 330/255

FOREIGN PATENT DOCUMENTS

| JP | 5-10988 | 1/1993 |
|----|---------|--------|
| JP | 5-315869 | 11/1993 |
| JP | 8-263157 | 10/1996 |
| JP | 9-260971 | 10/1997 |

* cited by examiner

*Primary Examiner*—Peguy JeanPierre
*Assistant Examiner*—Khai M. Nguyen
(74) *Attorney, Agent, or Firm*—Posz Law Group, PLC

(57) ABSTRACT

In a circuit according to the present invention, a multi-collector transistor is provided which includes first to third collectors so that, when a current does not flow from the second collector, a current from the first collector increases but a current from the third collector does not vary. When transistors of the circuit turn off because the voltage of an input signal gets out of an in-phase input voltage range, the supply of the current from the second collector comes to a stop and, hence, the current from the first collector increases. In this situation, further transistors carry out their on/off operations, thereby fixing the output of the circuit to a low level. That is, this circuit can, irrespective of poor pair compatibility between the transistors, fix the output logical level to a desired level when the voltage of an input signal gets out of an in-phase input voltage range.

2 Claims, 7 Drawing Sheets

OPERATIONAL AMPLIFICATION CIRCUIT, OVERHEAT DETECTING CIRCUIT AND COMPARISON CIRCUIT

BACKGROUND OF THE INVENTION

1) Field of the Invention

The present invention relates to an operational amplification circuit, an overheat detecting circuit and a comparison circuit.

2) Description of the Related Art

An arrangement of a conventional amplification circuit is as shown in FIG. 8. In FIG. 8, the operational amplification circuit a differential amplification circuit 10 for outputting a signal corresponding to an electric potential difference between input signals inputted to an inverting input terminal IN− and a non-inverting input terminal IN+, respectively, and an outputting circuit 20 for outputting a signal corresponding to an output of the differential amplification circuit 10.

The differential amplification circuit 10 is composed of PNP bipolar transistors 111 to 116, 121, 102 and 122 and NPN bipolar transistors 117 and 118. Each of the transistors 121 and 102 has a multi-collector configuration using two collectors. A common base signal from an external circuit (not shown) is inputted to a base of each of the transistors 121, 102 and 122 so that each collector outputs a constant current according to the voltage of the common base signal.

The bases of the transistors 113 and 114 are connected to the inverting input terminal IN− and the noninverting input terminal IN+ respectively.

The transistors 117 and 118 are connected through their bases to each other to provide a current mirror circuit. The collector of the transistor 117 is connected to the collector of the transistor 111 and further to the base of the transistor 115, and the collector of the transistor 118 is connected to the collector of the transistor 112 and further to the base of the transistor 116. Moreover, a current equal to a current flowing in the transistor 117 flows in the transistor 118.

The outputting circuit 20 is composed of PNP bipolar transistors 203, 204, 222 and NPN bipolar transistors 219, 220, 221.

The bases of the transistors 203 and 204 are connected in common to the bases of the transistors 121, 122 and 102 of the differential amplification circuit 10. Moreover, the base of the transistor 219 is connected to the junction between the collector of the transistor 121 and the emitter of the transistor 116, and the collector of the transistor 219 is connected to the collector of the transistor 203. Still moreover, the emitter of the transistor 219 is grounded through a resistor 230 to make an emitter follower circuit. Yet moreover, the emitter of the transistor 220 is grounded to make an emitted grounded circuit. The collector of the transistor 221 is connected to the positive electrode side of the power supply, the emitter of the transistor 221 is connected to an output terminal OUT. In addition, the emitter of the transistor 222 is connected to the outputting terminal OUT, and the collector of the transistor 222 is connected to the negative electrode side of the power supply.

A description will be given hereinbelow of an operation of the above-described circuit arrangement.

In a case in which an input signal voltage inputted to the inverting input terminal IN− becomes higher than an input signal voltage inputted to the non-inverting input terminal IN+, a current flowing in the transistor 114 becomes larger than a current flowing in the transistor 113 and, hence, a base current of the transistor 112 becomes larger than a base current of the transistor 111 so that a current I2 fed from the transistor 122 flows in the transistor 112 more than in the transistor 111. However, since the currents flowing in the transistors 117 and 118 are equal to each other, a base current of the transistor 115 increases while a base current of the transistor 116 decreases.

Therefore, a current I3' flowing in the transistor 116 decreases while a base current of the transistor 219 increases. Moreover, a base current of the transistor 220 increases while base currents of the transistors 221 and 222 decrease. Still moreover, the transistor 221 turns off while the transistor 222 turns on, so the logical level of the output terminal OUT becomes low.

In addition, in a case in which an input signal voltage inputted to the inverting input terminal IN− becomes lower than an input signal voltage inputted to the non-inverting input terminal IN+, a current flowing in the transistor 113 becomes larger than a current flowing in the transistor 114 and, hence, a base current of the transistor 111 becomes larger than a base current of the transistor 112, so a current I2 fed from the transistor 122 flows in the transistor 111 more than in the transistor 112. However, since the currents flowing in the transistors 117 and 118 are equal to each other, a base current of the transistor 116 increases while a base current of the transistor 115 decreases.

Therefore, the current I3' flowing in the transistor 116 increases while the base current of the transistor 219 decreases. Moreover, the base current of the transistor 220 decreases while the base currents of the transistors 221 and 222 increase. Still moreover, the transistor 221 turns on while the transistor 222 turns off, so the logical level of the output terminal OUT becomes high.

In the case of a differential amplification circuit, the differential-amplification-possible input voltage range is referred to as an in-phase input voltage range. In the circuit shown in FIG. 8, when the power supply voltage is taken to be VCC, the emitter-collector voltage (voltage between the emitter and the collector) of the transistor 122 is taken as Vsat and the emitter-base forward-direction voltage of each of the transistors 111 to 114 is taken as Vf (so-called the emitter-base voltage), the upper limit of the in-phase input voltage range is given by VCC− 2Vf− Vsat.

In the operational amplification circuit shown in FIG. 8, although both the input signal voltages to be inputted to the inverting input terminal IN− and the non-inverting input terminal IN+ are made to work within the in-phase input voltage range, both the input signal voltages inputted to the inverting input terminal IN− and the non-inverting input terminal IN+ can get out of the in-phase input voltage range due to an increase in the input signal voltage to be inputted to each of the inverting input terminal IN− and the noninverting input terminal IN+ or a drop of the power supply voltage VCC.

In this case, the transistors 113 and 114 turn off and the transistors 111 and 112 also turn off. Accordingly, the current I2 does not flow in the transistors 111 and 112.

In addition, the transistor 115 turns on, and a current I1 fed from the transistor 121 flows into each of the bases of the transistors 117 and 118. Since equal currents flow into the transistors 117 and 118, the transistor 116 turns on and a base current of the transistor 116 flows in the collector of the transistor 118.

In the above-described operational amplification circuit, when the current amplification factors of the transistors 115, 116, 117 and 118 are taken as hFE15, hFE16, hFE17 and hFE18, the current I3' flowing in the emitter of the transistor 116 is given by the following equation (1).

$$I3' = I1/hFE15 \cdot (1 - (1/hFE17 + 1/hFE18)) \cdot \quad (1)$$

$$hFE18/hFE17 \cdot hFE16$$

$$= I1 \cdot \left(1 - \frac{1 + hFE17/hFE18}{hFE17}\right) \cdot \frac{hFE18}{hFE17} \cdot \frac{hFE16}{hFE15}$$

In general, in the equation (1), since hFE17 and hFE18 are approximately 100 to 200, assuming that (1+hFE17/hFE18)/hFE17≈0 (approximately equal to 0), the current I3' flowing in the emitter of the transistor 116 is approximated to the equation (2).

$$I3' = I1 \cdot \frac{hFE18}{hFE17} \cdot \frac{hFE16}{hFE15} \quad (2)$$

In the equation (2), in a case in which the pair compatibility between the transistors 115, 116 and between 117, 118 are high, the current amplification factors hFE15 and hFE16 of the transistors 115 and 116 are equal to each other and the current amplification factors hFE17 and hFE18 of the transistors 117 and 118 are equal to each other and, hence, I3'=I1. Moreover, if the pair compatibility between the multi-collectors of the transistor 121 is high, I1=I3.

However, the relationship between I3 and I3' becomes I3>I3' or I3<I3' depending upon the pair compatibility of the transistors 115, 116 and 117, 118 or the pair compatibility of the multi-collector of the transistor 121. Incidentally, in fact, the relationship does not show I3<I3', and venturing to say, the current drive ability of the transistor 116 is larger than I3, and I3=I3'. In the case of I3>I3', the transistor 219 turns on, the transistor 220 turns on, the transistor 221 turns off and the transistor 222 turns on, so the logical level of the output terminal OUT becomes low. On the other hand, in the case of I3=I3', the transistor 219 turns off, the transistor turns off, the transistor 221 turns on and the transistor 222 turns off, so the logical level of the output terminal OUT becomes high.

Accordingly, in a case in which there appears an input outside the aforesaid in-phase input voltage range, there is a problem in that the logical level of the output terminal OUT cannot be fixed to a desired level due to the pair compatibility of the transistors 115, 116 and 117, 118 or the pair compatibility of the multi-collector of the transistor 121.

In this case, although it is considered that a balance resistor is inserted into the emitters of the transistors 117 and 118 to deteriorate the balance on purpose for fixing the logical level of the output terminal OUT to a desired level, this creates a problem in that, for example, the offset performance deteriorates in an normal operation.

In addition, FIG. 9 shows a conventional overheat detecting circuit. The conventional overheat detecting circuit is provided with a PNP multi-collector transistor 301, an NPN transistor 302, a temperature detecting diode 303, a comparator 304, a constant-voltage source 305 and a diode 306.

As illustrated, a base signal from an external circuit (not shown) is inputted to the base of the multi-collector transistor 301 and, in accordance with a voltage of this base signal, currents I5 and I6 (for example, 10 μA) equal to each other flow in collectors designated at circled numerals 5 and 6. Moreover, the current I5 flows from the collector 5 into the transistor 302 while the current I6 flows from the collector 6 into the temperature detecting diode 303.

As indicated by VF (10 μA) in FIG. 10, a forward-direction drop voltage VF of the temperature detecting diode 303 lowers as the temperature rises and, conversely, it rises as the temperature drops.

Moreover, the forward-direction drop voltage VF of the temperature detecting diode 303 is applied to an inverting input terminal—of the comparator 304, while a threshold voltage Vth is applied through the constant-voltage source 305 to a non-inverting input terminal + of the comparator 304.

In the circuit shown in FIG. 9, in a case in which the temperature is low and the voltage VF applied to the inverting input terminal—of the comparator 304 is higher than the threshold voltage Vth applied to the non-inverting input terminal + of the comparator 304, a low-level signal is outputted from an output terminal of the comparator 304. Meanwhile, if, due to a rise of the temperature, the voltage VF applied to the inverting input terminal —of the comparator 304 becomes lower than the threshold voltage Vth applied to the non-inverting input terminal + of the comparator 304, a high-level signal is outputted from the output terminal of the comparator 304.

On the other hand, as indicated by VF (10 μA), VF (20 μA) in FIG. 10, the forward-direction drop voltage VF of the temperature detecting diode 303 becomes higher as the current flowing in the temperature detecting diode 303 becomes larger.

The circuit shown in FIG. 9 is made such that the detected temperature has a hysteresis by varying the current flowing in the temperature detecting diode 303. The transistor 302 and the diode 306 organizes a circuit whereby the detected temperature has the hysteresis.

In FIG. 9, when the forward-direction drop voltage VF of the temperature detecting diode 303 becomes below the threshold voltage Vth with a rise of the temperature, the transistor 302 turns on in response to the high-level signal from the comparator 304, and the current I6 flowing in the collector 6 of the multi-collector transistor 301 flows into the transistor 302. That is, the current I6 (10 μA) from the collector 6 of the multi-collector transistor 301 flows in the temperature detecting diode 303.

Moreover, in a case in which the temperature is low and the forward-direction drop voltage VF of the temperature detecting diode 303 exceeds the threshold voltage Vth, the transistor 302 turns off in response to the low-level signal from the comparator 304, and the current I6 flowing in the collector 6 of the multi-collector transistor 301 flows through the diode 306 into the temperature detecting diode 303. That is, the current I5 from the collector 5 of the multi-collector transistor 301 and the current I6 from the collector 6 thereof (20 μA in total) flows in the temperature detecting diode 303.

Thus, in a case in which the detected temperature is lower than a temperature T1 and in a case in which the detected temperature rises from the temperature T1 to a temperature T2, the transistor 302 turns off, and the forward-direction drop voltage VF of the temperature detecting diode 303 shows a characteristic indicated by VF (20 μA) in FIG. 10. Conversely, in a case in which the detected temperature is higher than the temperature T2 and in a case in which the detected temperature drops from T2 to T1, the transistor 302 turns on, and the forward-direction drop voltage VF of the temperature detecting diode 303 shows a characteristic indicated by VF (10 μA) in FIG. 10.

As described above, the conventional overheat detecting circuit is designed to make the detected temperature have a hysteresis by varying the current flowing in the temperature detecting diode 303 through the use of the transistor 302 and the diode 306.

Furthermore, FIG. 11 shows an arrangement of a conventional comparison circuit. As illustrated, the comparison circuit is composed of resistors 401 to 403, an NPN transistor 404 and a comparator 405.

As illustrated, the resistors 401 to 403 are connected in series between a power supply VCC and the ground (GND), and a threshold voltage Vth obtained through the voltage division by the resistors 401 to 403 is applied to the inverting input terminal – of the comparator 405. In a case in which the voltage of an input signal inputted through an input terminal IN is higher than the threshold voltage Vth, a high-level signal is outputted from an output terminal of the comparator 405, and in a case in which the voltage of the input signal inputted through the input terminal IN is lower than the threshold voltage Vth, a low-level signal is outputted from the output terminal of the comparator 405.

Moreover, in the circuit shown in FIG. 11, the switching function of the transistor 404 varies the threshold voltage Vth serving as a reference voltage to make the comparison circuit have a hysteresis. That is, when the transistor 404 falls into an off state, as shown in FIG. 12, the threshold voltage Vth becomes VthH, and when the transistor 404 turns off, the threshold voltage Vth becomes VthL.

Still moreover, as shown in FIG. 12, if the voltage at the input terminal IN becomes higher than the threshold voltage VthL developing when the transistor 404 is on, the voltage at the output terminal OUT becomes at a high level, and if the voltage at the input terminal IN becomes lower than the threshold voltage VthH developing when the transistor 404 is off, the voltage at the output terminal OUT becomes at a low level.

As described above, in the conventional comparison circuit, the threshold voltage Vth obtained by the resistance division of the resistors 401 to 403 is applied to the inverting input terminal —of the comparator 405, and a hysteresis is developed by varying this threshold voltage Vth through the use of the switching of the transistor 404.

SUMMARY OF THE INVENTION

The present invention has been developed with a view to eliminating these problems, and it is therefore an object of the invention to, irrespective of poor transistor pair compatibility, fix the output logical level to a desired level when an input signal voltage gets out of the in-phase input voltage range.

Another object of the present invention is to provide an overheat detecting circuit capable of making the detected temperature have a hysteresis without using a diode for varying the current flowing in the temperature detecting diode.

A further object of the present invention is to provide a comparison circuit having a hysteresis which is constructed through the use of a new arrangement.

For this purpose, an operational amplification circuit according to an aspect of the present invention comprises a current supply circuit (101) whereby, when a current is not supplied to a first input-stage transistor circuit (111, 113) and a second input-stage transistor circuit (112, 114), a current to be supplied to one of fifth and sixth transistors (115, 116) increases while a current to be supplied to the other transistor does not increase.

Accordingly, in a case in which input signal voltages to an inverting input terminal (IN−) and a non-inverting input terminal (IN+) get out of an in-phase input voltage range and the first and second input-stage transistor circuits (111, 113, 112, 114) turn off so that a current (I2) to be supplied thereto does not flow, the current to be supplied to one of the fifth and sixth transistors (115, 116) increases while the current to be supplied to the other does not vary, irrespective of poor pair compatibility between third and fourth transistors (117, 118) or between the fifth and sixth transistors (115, 116), it is possible to fix the magnitude relationship between a current (I3) to be supplied to the sixth current supply transistor (116) and a current (I3') flowing in the sixth current supply transistor, which allows the output logical level of an outputting circuit (20) to be fixed to (stabilized at) a desired level.

In this arrangement, according to a further aspect of the present invention, the aforesaid current supply circuit (101) comprises a multi-collector transistor which has a first collector connected to the first and second input-stage transistor circuits (111, 113, 112, 114), a second collector connected to one of the fifth and sixth transistors (115, 116) and a third collector connected to the other transistor (115, 116), and when the supply of a current from the first collector stops, a portion of a current flowing in an emitter thereof flows in the second collector.

Furthermore, in accordance with a further aspect of the present invention, there is provided an overheat detecting circuit comprising temperature detecting means (303) whose output voltage (VF) varies in accordance with a variation of temperature, threshold voltage generating means (305) for generating a predetermined threshold voltage, comparison means (304) for making a comparison between the output voltage (VF) of the temperature detecting means (303) and a threshold voltage (Vth), a transistor (302) which turns on/off in accordance with a comparison result in the comparison means, and a multi-collector transistor (301) whose first collector is connected to the temperature detecting means (303) and second collector is connected to the transistor (302) so that a current is supplied through the first collector to the temperature detecting means (303) and a current is supplied through the second collector to the transistor (302) and which is made to, when the supply of the current through the second collector to the transistor (302) comes to a stop, increase the current flowing through the first collector into the temperature detecting means (303).

Thus, since the multi-collector transistor (301) is provided which, when the current from the second collector to the transistor (302) disappears, increases the current flowing through the first collector into the temperature detecting means, in the overheat detecting circuit which provides a hysteresis on the detected temperature, the detected temperature can show a hysteresis without the use of a diode (306) shown in FIG. 9 for varying the current flowing in the temperature detecting diode.

Still furthermore, in accordance with a further aspect of the present invention, there is provided a comparison circuit comprising threshold voltage generating means for generating a threshold voltage (Vth) through resistance division between a plurality of resistors (401, 407), comparison means (405) for making a comparison between an input signal inputted through an input terminal and the threshold voltage (Vth) generated from the threshold voltage generating means, a transistor (404) which turns on/off in accordance with a comparison result in the comparison means, and a multi-collector transistor (406) whose first collector is connected to the junction between the plurality of resistors (401, 407) and second collector is connected to the transistor (404) so that a current is supplied through the first collector to at least one of the plurality of resistors (401, 407) and a current is supplied through the second collector to the transistor (404) and which is made to, when the supply of the current through the second collector to the transistor (404) comes to a stop, increase the current flowing through the first collector to at least the one of the plurality of resistors (401, 407).

Thus, the multi-collector transistor (406) is provided which, when the supply of the current through the second collector to the transistor (404) comes to a stop, increase the current flowing through the first collector to at least the one of the plurality of resistors (401, 407), and this provides a new arrangement for the comparison circuit giving a hysteresis.

The reference numerals in parentheses attached to the respective means or members signify the corresponding relation with respect to the concrete means in an embodiment which will be described later.

BRIEF DESCRIPTION OF THE DRAWINGS

Other objects and features of the present invention will become more readily apparent from the following detailed description of the preferred embodiments taken in conjunction with the accompanying drawings in which.

DESCRIPTION OF THE PREFERRED EMBODIMENTS

Embodiments of the present invention will be described hereinbelow with reference to the drawings.

First Embodiment

Figure 1:
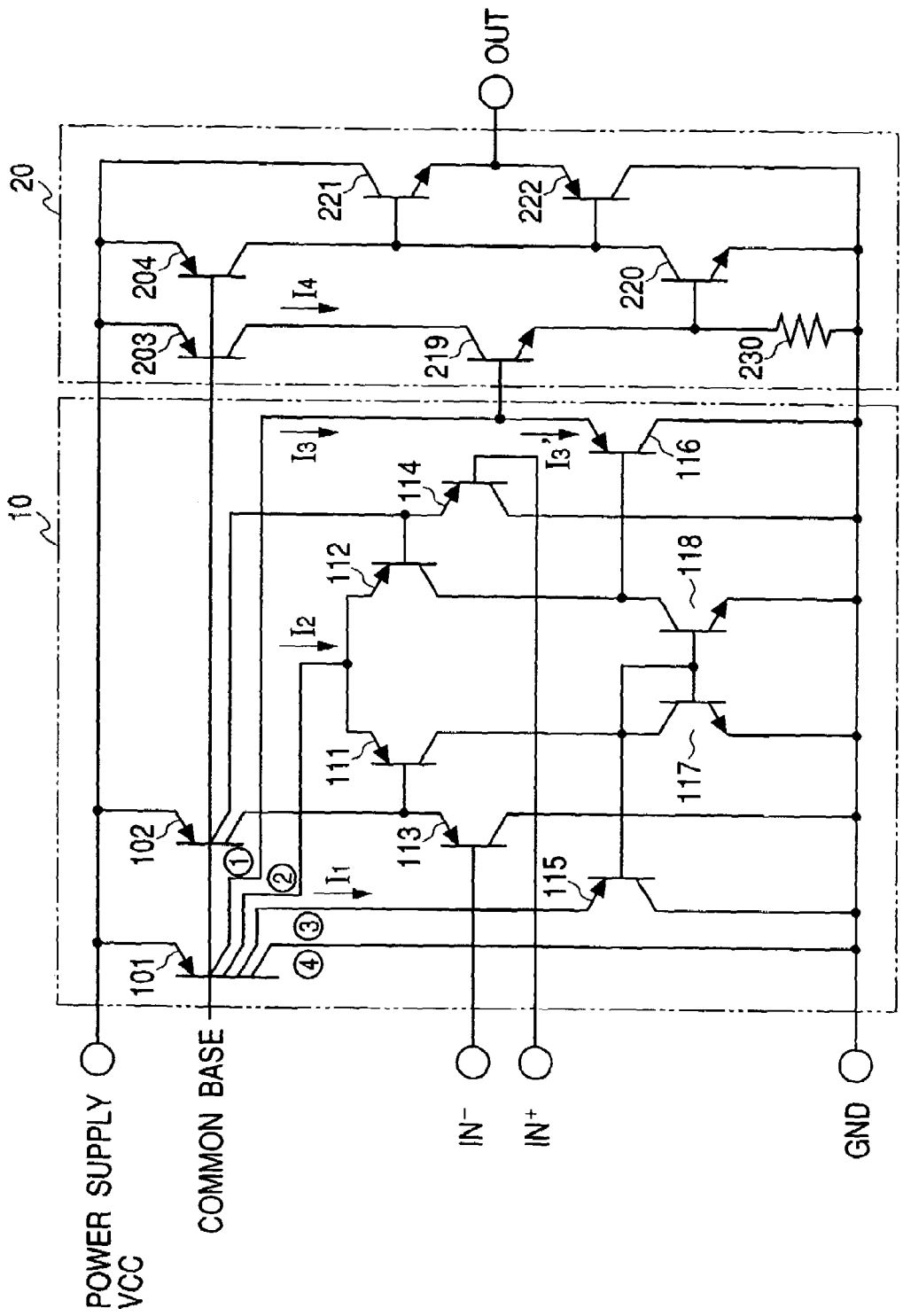
FIG. 1 is an illustration of an operational amplification circuit according to a first embodiment of the present invention.
Figure 8:
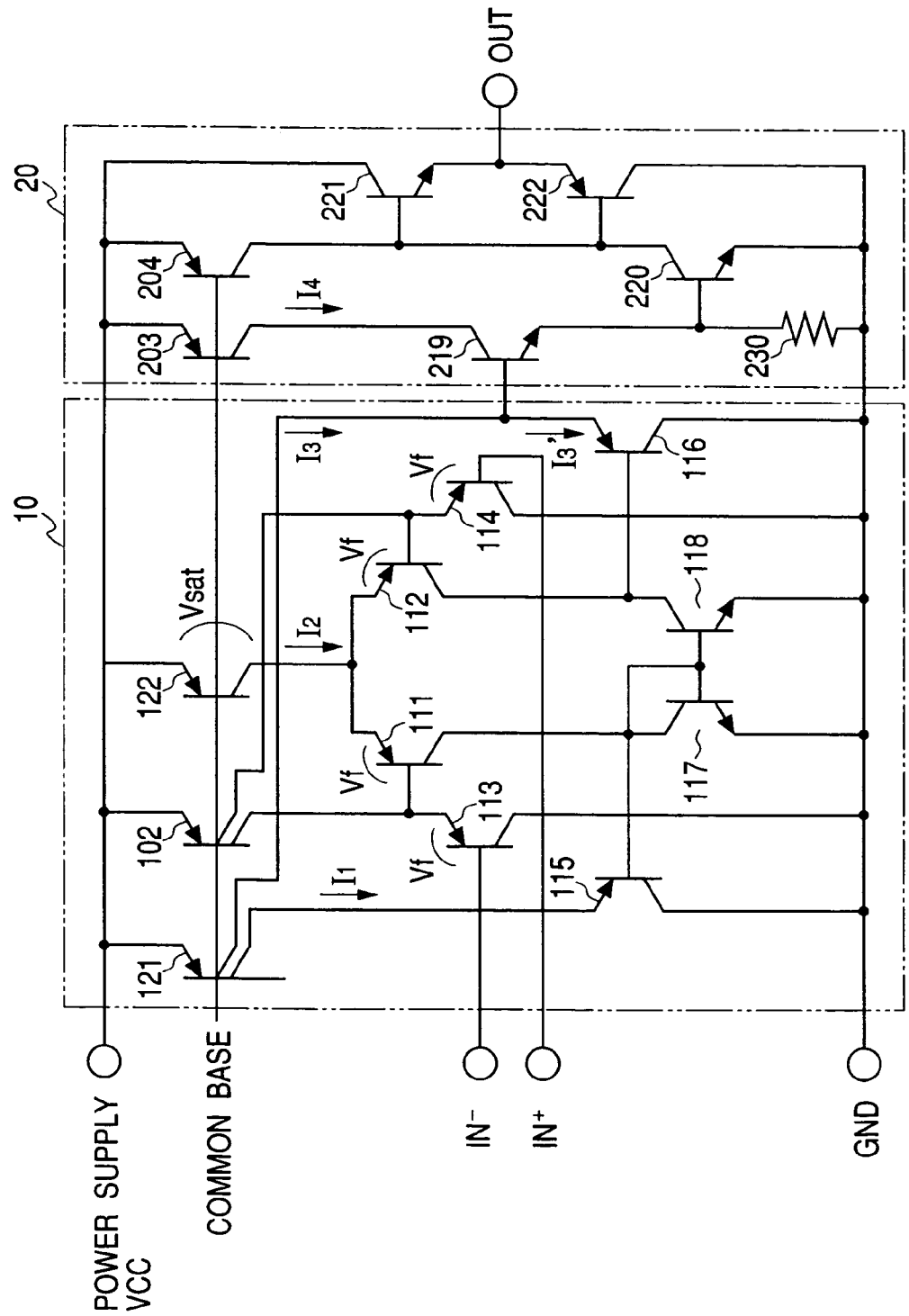
FIG. 8 is an illustration of an arrangement of a conventional operational amplification circuit.

FIG. 1 is an illustration of an arrangement of an operational amplification circuit according to a first embodiment of the present invention. As compared with the operational amplification circuit shown in FIG. 8, a transistor 101 is provided in place of the transistors 121 and 122. The other arrangement is the same as that in FIG. 8.

The transistor 101 has four collectors designated at circled numerals 1 to 4, and the collector 1 is connected to an emitter of a transistor 116, the collector 2 is connected to emitters of transistors 111 and 112, and the collector 3 is connected to an emitter of a transistor 115. The collector 4 is grounded and is not put to use.

Figure 2:
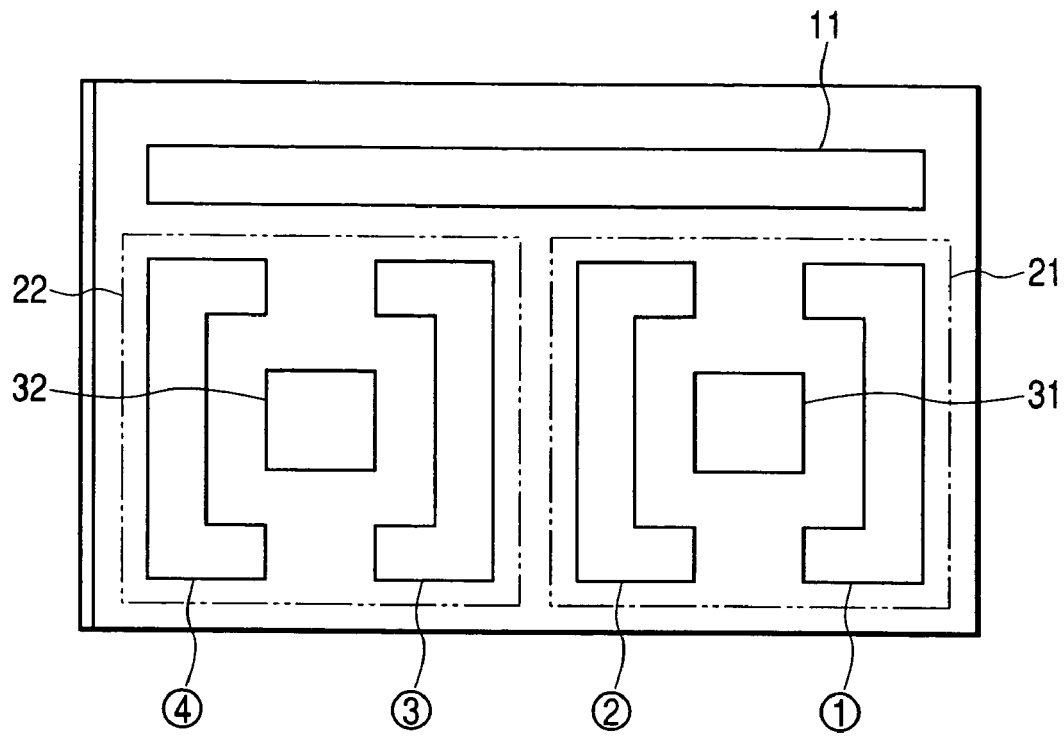
FIG. 2 is an illustrative view showing an layout of a multi-collector transistor according to the first embodiment.

FIG. 2 is an illustrative view showing an layout of the transistor 101. As illustrated, in the transistor 101, two cells 21 and 22 are provided with respect to a common base 11. In the cell 21, the two collectors 1 and 2 are formed in a paired condition with respect to one emitter 31, and in the cell 22, the two collectors 3 and 4 are formed in a paired condition with respect to one emitter 32. The emitter 31 in the cell 21 and the emitter 32 in the cell 22 are connected through pattern wiring in an IC chip.

With this arrangement, a constant current flows from each of the collectors 1 to 4 in accordance with a voltage of a common base signal to be applied to the base of the transistor 101. In this case, if a current does not flow in one of the paired collectors, a current flowing in the other collector increases. For example, if a collector current does not flow from the collector 2, a portion of the current from the emitter 31 which makes a current flow into the collector 2 flows into the collector 1 paired with the collector 2 so that the collector current of the collector 1 increases. The inventors have confirms that, although depending upon a transistor manufacturing process or a size of an element, the collector current in the collector 1 increases approximately 1.5 times.

In the operational amplification circuit shown in FIG. 1, a common base signal from an external circuit (not shown) is inputted to each of the bases of the transistors 101 and 102, and a constant current is outputted from each collector in accordance with a voltage of this common base signal. Accordingly, an operation to be conducted when the input signals inputted to the inverting input terminal IN− and the non-inverting input terminal IN+ are in the in-phase input voltage range is basically the same as that of the arrangement shown in FIG. 8, and in a case in which an input voltage to the inverting input terminal IN− is higher than an input voltage to the noninverting input terminal IN+, the logical level of the output terminal OUT becomes low, and when the input voltage to the inverting input terminal IN− is lower than the input voltage to the non-inverting input terminal IN+, the logical level of the output terminal OUT becomes high.

Secondly, a description will be given hereinbelow of an operation to be conducted when an input signal exceeding an in-phase input voltage is inputted to both the non-inverting input terminal IN+ and the inverting input terminal IN−.

When an input signal exceeding an in-phase input voltage is inputted to both the noninverting input terminal IN+ and the inverting input terminal IN−, transistors 113 and 114 turn off while transistors 111 and 112 turn off. Therefore, a current I2 from the collector 2 of the transistor 101 does not flow in the transistors 111 and 112. In this case, a collector current I3 in the collector 1 of the transistor 101 increases. In this connection, the collector currents in the collectors 3 and 4 constituting the cell 22 do not vary.

Meanwhile, for fixing the logical level of the output terminal OUT to a low level irrespective of poor pair compatibility between the transistors 115 and 116 and between the transistors 117 and 118, there is a need to turn on a transistor 219.

When the current amplification factor of the transistor 219 is taken as hFE19 and a current to be supplied from the collector of a transistor 203 is taken as I4, a condition that the transistor 219 enters an on state is expressed as the following equation (3).

$$I3 < I3' + I4/hFE19 \qquad (3)$$

In the equation (3), assuming that I4/hFE19≈(is approximately equal to) 0 and using the aforesaid equation (2), the condition that the transistor 219 turns on is expressed as the following equation (4).

$$I3 > I1 \cdot \frac{hFE18}{hFE17} \cdot \frac{hFE16}{hFE15} \qquad (4)$$

On the other hand, in a case in which the collector current does not flow from the collector 2, since the collector current of the collector 1 increases approximately 1.5 times as mentioned above, the relationship between the current I3 flowing in the collector 1 and the current I1 flowing in the collector 3 is expressed as the following equation (5).

$$I3 \approx I1 \cdot 1.5 \qquad (5)$$

Accordingly, the relationship expressed as the following equation (6) is derived from the equations (4) and (5).

$$\frac{I3}{I1} \approx 1.5 > \frac{hFE18}{hFE17} \cdot \frac{hFE16}{hFE15} \qquad (6)$$

As seen from the equation (6), the tolerance of the pair compatibility between the transistors 115, 116 and between the transistors 117, 118 depends upon the ratio of the current I1 and the current I3. That is, in a case in which the pair compatibility between the current amplification factors hFE15 and hFE16 of the transistors 115 and 116 and the current amplification factors hFE17 and hFE18 of the transistors 117 and 118 are poor, when the respective current amplification factors hFE15 to hFE18 are within an allowable range satisfying the condition expressed by the equation (6), even if both the input signal voltages to be inputted to the inverting input terminal IN− and the non-inverting input terminal IN+ get out of the in-phase input voltage range, it is possible to surely turn on the transistor 219, thereby fixing the logical level of an output signal from the output terminal OUT to a low level.

Incidentally, in general, in a case in which the transistors are arranged in a state paired, the dispersion of the current amplification factors can be suppressed to be below 5% and it is easy to satisfy the condition of the equation (6).

Second Embodiment

In the above-described first embodiment, the logical level of an output signal from the output terminal OUT is set at a low level when both the input signal voltages to be inputted to the inverting input terminal IN− and the non-inverting input terminal IN+ get out of the in-phase input voltage range. On the other hand, according to the second embodiment, the logical level of an output signal from the output terminal OUT is set to a high level.

Figure 3:
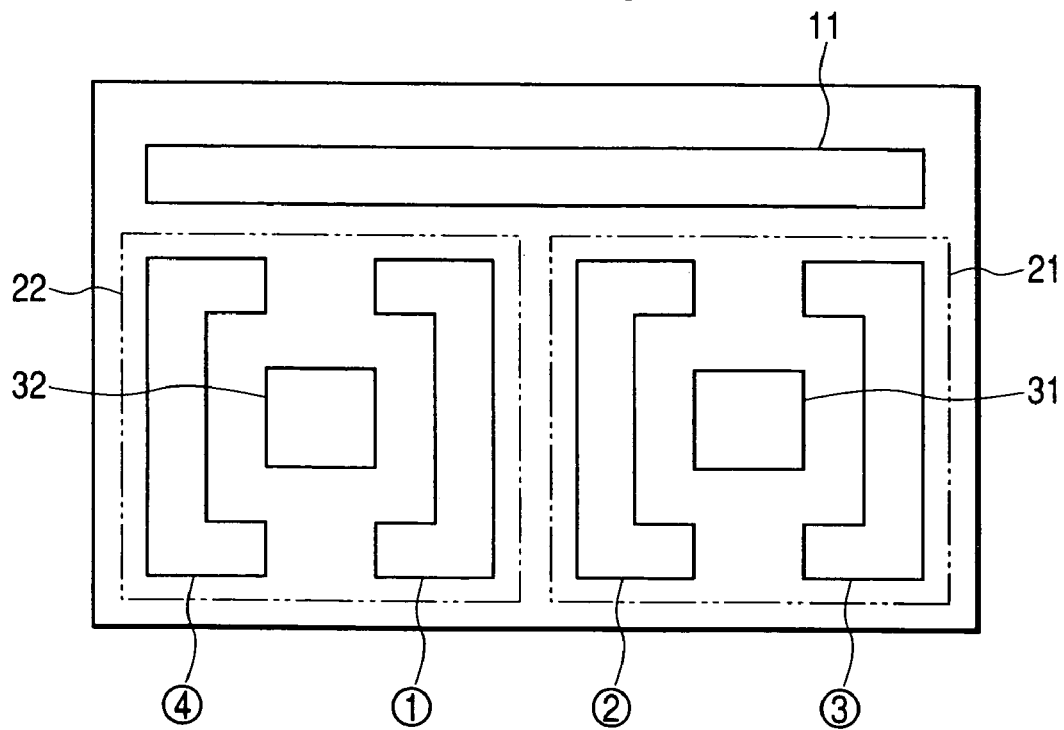
FIG. 3 is an illustrative view showing an layout of a multi-collector transistor according to a second embodiment of the present invention.

FIG. 3 is an illustrative view showing a layout of a multi-collector transistor 101 according to the second embodiment of the present invention. As illustrated, the transistor 101 is arranged such that two cells 21 and 22 are provided with respect to one common base 11. In the cell 21, two collectors paired, designated at circled numerals 3 and 2, are formed with respect to one emitter 31, and in the cell 22, two collectors paired, designated at circled numerals 1 and 4, are formed with respect to one emitter 22. The emitter 31 in the cell 21 and the emitter 32 in the cell 22 are connected through pattern wiring in an IC chip.

In FIG. 3, by stopping a flow of the collector current from the collector 2, a portion of the current from the emitter 31 which makes a current flow in the collector 2 flows into the collector 3 paired with the collector 2 and, in consequence, the collector current of the collector 3 increases.

Accordingly, both the input signal voltages to be inputted to the inverting input terminal IN− and the noninverting input terminal IN+ get out of the in-phase input voltage range and all the transistors 111 to 114 fall into an off state, and when a flow of a current I2 from the collector 2 of the transistor 101 stops, an current I1 from the collector 3 of the transistor 101 increases. In this case, the collector currents of the collectors 1 and 4 constituting the cell 22 do not vary.

Meanwhile, for fixing the logical level of the output terminal OUT to a high level irrespective of poor pair compatibility between the transistors 115 and 116 or between the transistors 117 and 118, there is a need to turn off a transistor 219.

When the current amplification factor of the transistor 219 is taken as hFE19 and a current to be supplied from the collector of the transistor 203 is taken as I4, a condition that the transistor 219 enters an off state is expressed as the following equation (7).

$$I3 < I3' + I4/hFE19 \qquad (7)$$

In the equation (7), assuming that I4/hFE19≈(is approximately equal to) 0 and using the aforesaid equation (2), the condition that the transistor 219 turns off is expressed as the following equation (8).

$$I3 < I1 \cdot \frac{hFE18}{hFE17} \cdot \frac{hFE16}{hFE15} \qquad (8)$$

On the other hand, in a case in which the collector current does not flow from the collector 2, since the collector current of the collector 3 increases approximately 1.5 times as mentioned above, the relationship between the current I3 flowing in the collector 1 and the current I1 flowing in the collector 3 is expressed as the following equation (9).

$$I3 \approx I1 \cdot 1/1.5 \qquad (9)$$

Accordingly, the relationship expressed as the following equation (10) is derived from the equations (8) and (9).

$$\frac{I3}{I1} \approx 0.67 < \frac{hFE18}{hFE17} \cdot \frac{hFE16}{hFE15} \qquad (10)$$

As seen from the equation (10), the tolerance of the pair compatibility between the transistors 115, 116 and between the transistors 117, 118 depends upon the ratio of the current I1 and the current I3. That is, in a case in which the pair compatibility between the current amplification factors hFE15 and hFE16 of the transistors 115 and 116 and the current amplification factors hFE17 and hFE18 of the transistors 117 and 118 are poor, when the respective current amplification factors hFE15 to hFE18 are within an allowable range satisfying the condition of the equation (10), even if both the input signal voltages to be inputted to the inverting input terminal IN– and the noninverting input terminal IN+ get out of the in-phase input voltage range, it is possible to surely turn off the transistor 219, thereby fixing the logical level of an output signal from the output terminal OUT to a high level.

Third Embodiment

The third embodiment of the present invention is the same as the above-described first and second embodiments in the employment of a phenomenon in which, in a multi-collector arrangement, when a flow of a current in one collector stops, a current in the other collector increases.

Although in the above-described first and second embodiments a multi-collector transistor is provided which includes a cell in which two collectors paired are formed with respect to one emitter and the phenomenon that, when a current does not flow in one collector, a current flowing in the other collector increases is applied to an operational amplification circuit, in this embodiment this phenomenon is applied to an overheat detecting circuit.

Figure 4:
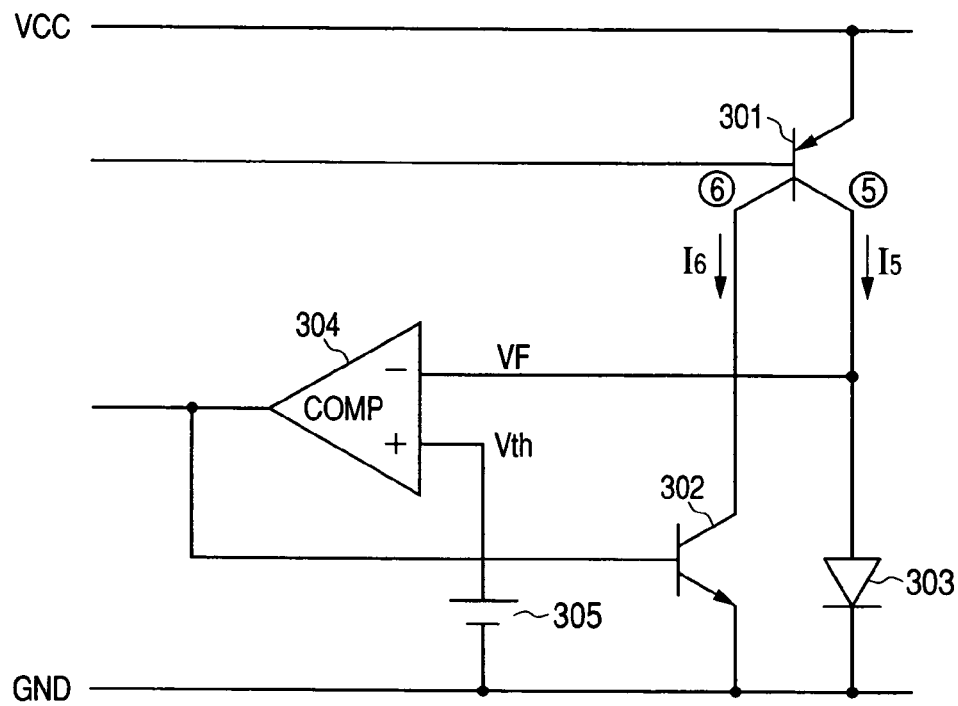
FIG. 4 is an illustration of an arrangement of an overheat detecting circuit according to a third embodiment of the present invention.
Figure 9:
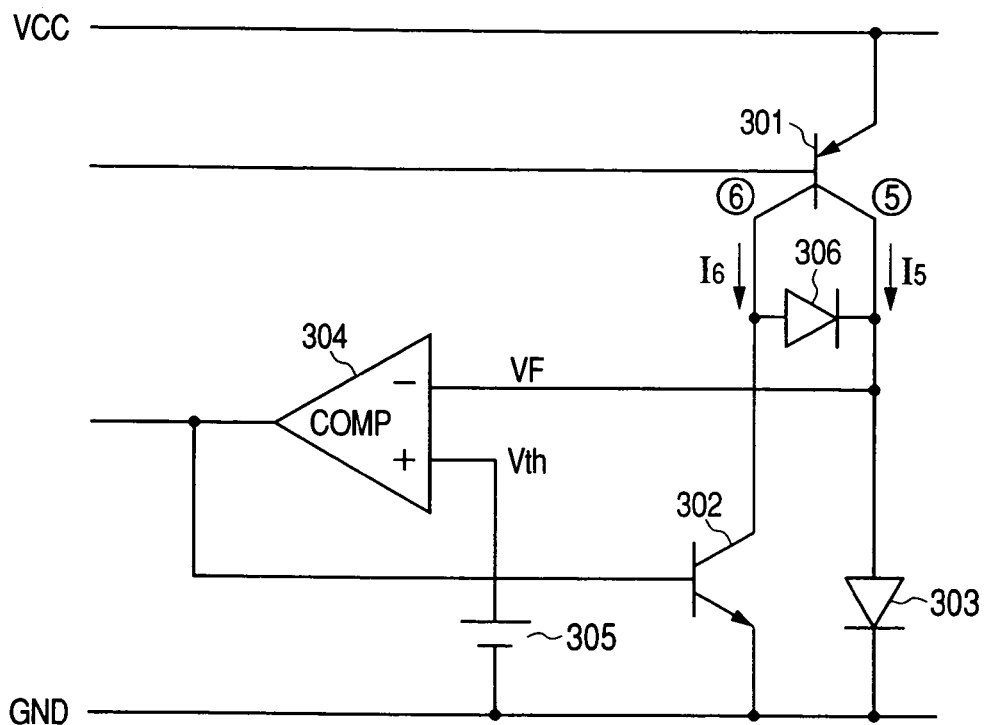
FIG. 9 is an illustration of an arrangement of a conventional overheat detecting circuit.
Figure 10:
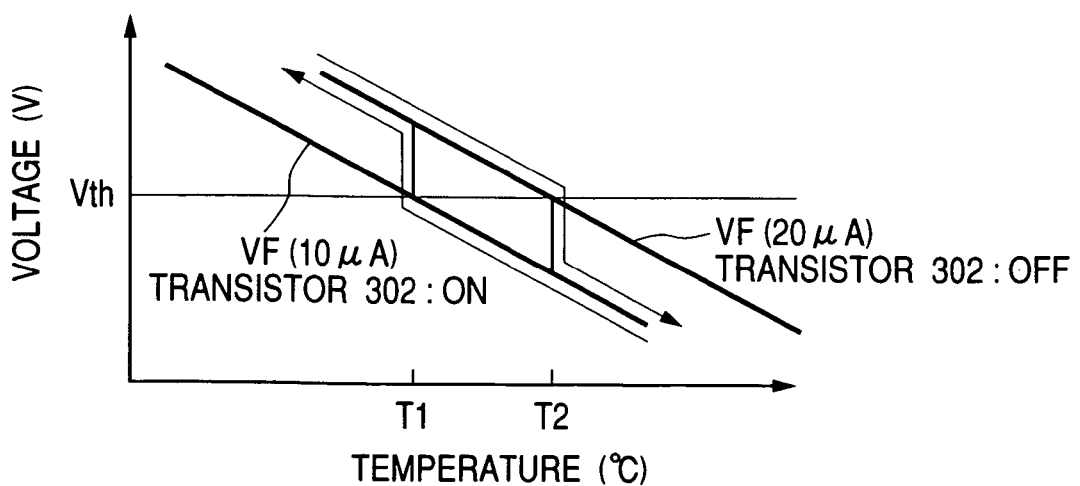
FIG. 10 is an illustration of a forward-direction drop voltage characteristic of a temperature detecting diode of the conventional overheat detecting circuit.
Figure 11:
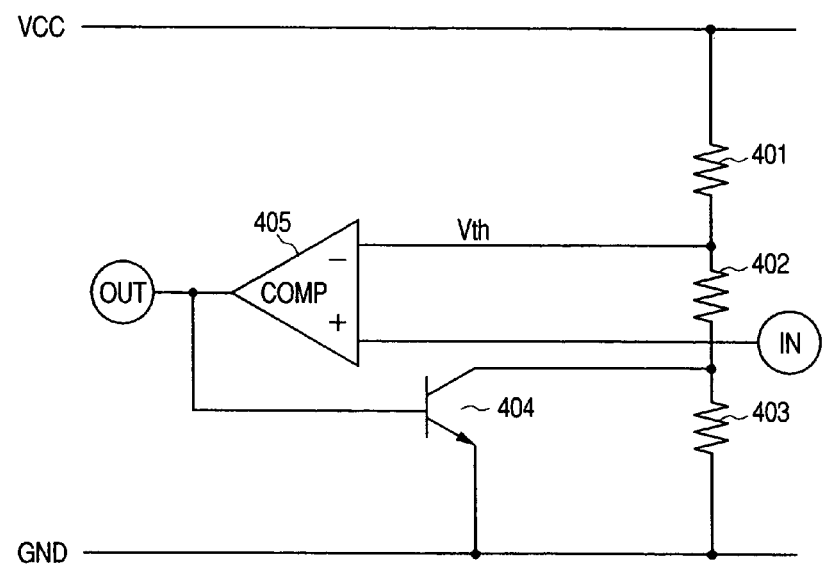
FIG. 11 is an illustration of an arrangement of a conventional comparison circuit.
Figure 12:
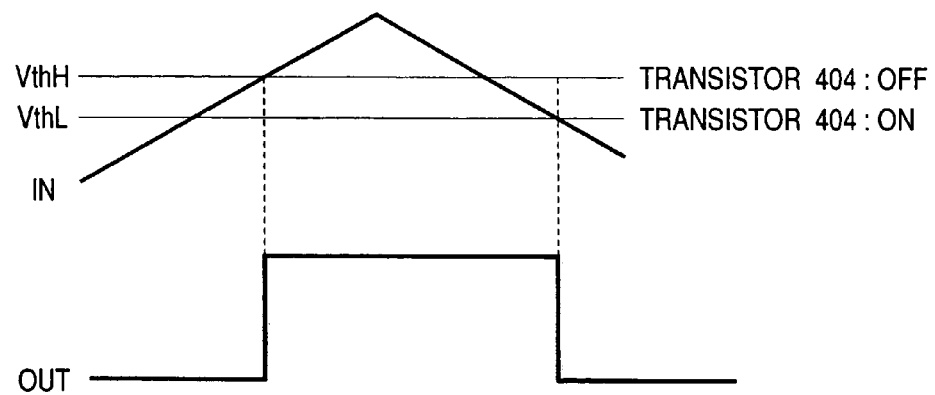
FIG. 12 is an illustration of a hysteresis characteristic of the conventional comparison circuit.

FIG. 4 is an illustration of an arrangement of an overheat detecting circuit according to this embodiment. The parts which are the same as those in FIG. 9 are marked with the same reference numerals, and the description thereof will be omitted for brevity and will be given of only the difference therefrom. In the overheat detecting circuit shown in FIG. 4, the diode 306 is not provided as compared with the circuit shown in FIG. 9.

In FIG. 4, in a case in which, with a rise in temperature, the forward-direction drop voltage VF of a temperature detecting diode 303 becomes below a threshold voltage Vth, a transistor 302 turns on in response to a high-level signal from a comparator 304, and a current I6 (10 μA) flowing in a collector 6 (circled) of a multi-collector transistor 301 flows through the transistor 302 and a current I5 (10 μA) from a collector 5 (circled) of the multi-collector transistor 301 flows through the temperature detecting diode 303.

On the other hand, if the temperature is low and the forward-direction drop voltage VF of the temperature detecting diode 303 exceeds the threshold voltage Vth, since the transistor 302 turns off in response to a low-level signal from the comparator 304, the current from the collector 6 serving as one collector of the multi-collector transistor 301 to the transistor 302 comes to a stop. The current flowing in the collector 5 serving as the other collector of the multi-collector transistor 301 increases.

According to the experiments by the inventors, when a current does not flow in one of paired collectors of a multi-collector transistor, the current flowing in the other collector increases approximately 1.5 times. Accordingly, when the transistor 302 falls into an off state, the current flowing in the temperature detecting diode 303 increases from 10 μA to 15 μA.

Figure 5:
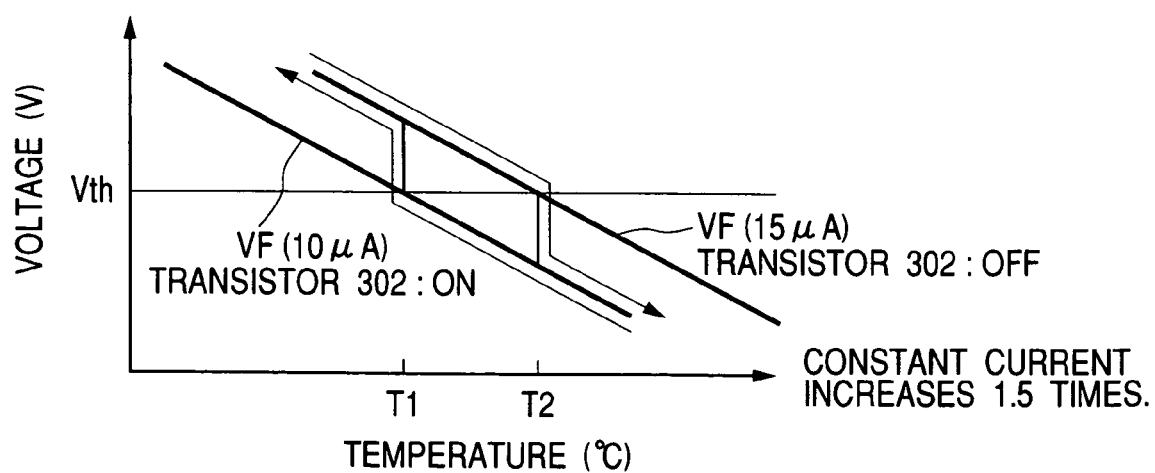
FIG. 5 is an illustration of a forward-direction drop voltage characteristic of a temperature detecting diode of the overheat detecting circuit according to the third embodiment.

That is, as shown in FIG. 5, in a case in which the detected temperature is lower than a temperature T1 and the detected temperature rises from T1 to T2, the transistor 302 turns off, and the forward-direction drop voltage VF shows a characteristic indicated by VF (15 μA). Conversely, in a case in which the detected temperature is higher than the temperature T2 and the detected temperature lowers from T2 to T1, the transistor 302 turns on, so the forward-direction drop voltage VF shows a characteristic indicated by VF (10 μA).

Thus, in the overheat detecting circuit shown in FIG. 4, in the multi-collector transistor having a cell in which two connectors are formed in a state paired with respect to one emitter, the detected temperature has a hysteresis owing to the employment of the phenomenon that, when no current flows in one of the collectors, the current flowing in the other collector increases.

As mentioned above, in the overheat detecting circuit comprising the temperature detecting diode 303 whose forward-direction drop voltage VF varies in accordance with a variation of temperature, the constant-voltage source 305 for generating a predetermined threshold voltage Vth and a comparator for making a comparison between the forward-direction drop voltage VF of the temperature detecting diode 303 and the threshold voltage Vth, a transistor 302 is provided which turns on/off in accordance with a comparison result of the comparator 304 and the multi-collector transistor 301 is further provided which is made such that its first collector is connected to the temperature detecting means 303 and its second collector is connected to the transistor 302 so that a current is supplied through the first collector to the temperature detecting means 303 and a current is supplied through the second collector to the transistor 302, wherein, when the supply of the current through the second collector to the transistor 302 comes to a stop, an increase of the current flowing through the first collector in the temperature detecting means 303 takes place. Therefore, in the overheat detecting circuit which provides a hysteresis on the detected temperature, the detected temperature can show a hysteresis without the use of a diode 306 shown in FIG. 9 for varying the current flowing in the temperature detecting diode 303.

Fourth Embodiment

Although in the above-described first and second embodiments a multi-collector transistor which includes a cell in which two collectors paired are formed with respect to one emitter and which shows the phenomenon that, when a current does not flow in one collector, a current flowing in the other collector increases is applied to an operational amplification circuit, this embodiment applies this phenomenon in a comparison circuit.

Figure 6:
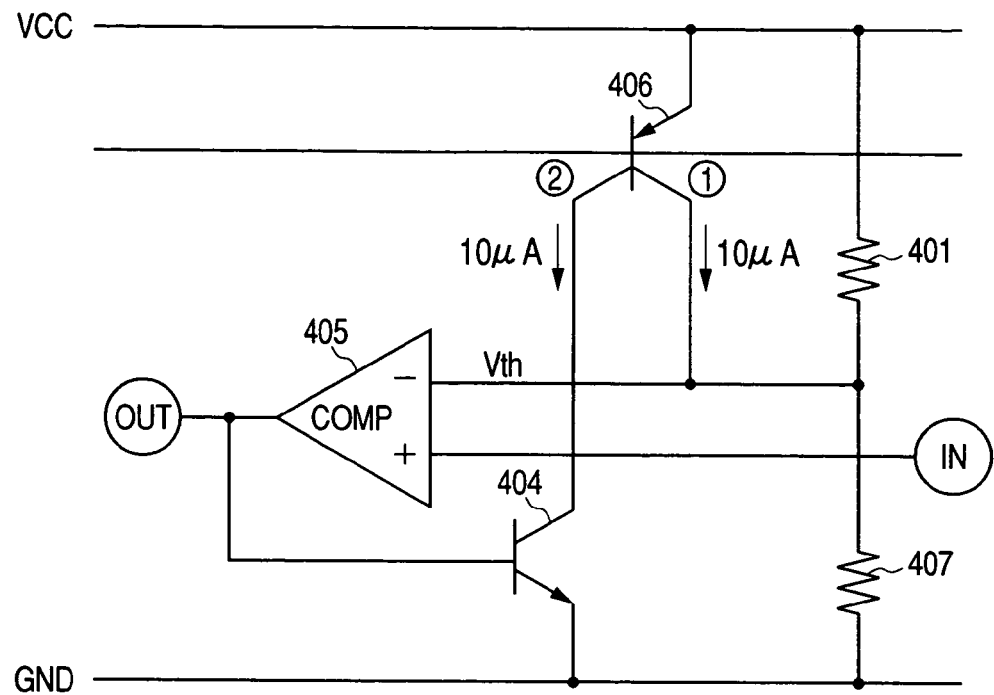
FIG. 6 is an illustration of an arrangement of a comparison circuit according to a fourth embodiment of the present invention.

FIG. 6 is an illustration of an arrangement of a comparison circuit according to this embodiment. As shown in FIG. 6, the comparison circuit is composed of resistors 401, 407, an NPN transistor 404, a comparator 405 and a PNP multi-collector transistor 406.

As illustrated, the resistors 401 and 407 are connected in series between a power supply VCC and the ground (GND). Moreover, a threshold voltage Vth developing through the resistance division of the resistors 401 and 407 is applied to an inverting input terminal—of the comparator 405. When the voltage of an input signal inputted through an input terminal IN is higher than the threshold voltage Vth, a high-level signal is outputted from an output terminal of the comparator 405, and if the voltage of the input signal inputted through the input terminal IN is lower than the threshold voltage Vth, a low-level signal is outputted from the output terminal of the comparator 405.

In addition, as illustrated, a base signal from an external circuit (not shown) is inputted to the base of the multi-collector transistor 406 and equal currents (each 10 μA) flow in the collector 1 (circled) and the collector 2 (circled) in accordance with the voltage of this base signal. Moreover, a current flows from the collector 2 into the transistor 404, while a current flows from the collector 1 into the resistor 407.

Still additionally, in the circuit shown in FIG. 6, the current flowing in the collector 2 of the multi-collector transistor 406 is varied by switching the transistor 404 so that the comparison circuit produces a hysteresis.

That is, when the transistor 404 turns on, a current (10 μA) flows from the collector 2 of the multi-collector transistor 406 into the transistor 404, and a current (10 μA) flows from the collector 1 of the multi-collector transistor 406 into the resistor 407. On the other hand, if the transistor 404 turns off, the current from the collector 1 of the multi-collector transistor 406 disappears in the transistor 404 and, hence, the current flowing from the collector 2 of the multi-collector transistor 406 to the resistor 407 increases approximately 1.5 times so that the threshold voltage Vth rises.

Figure 7:
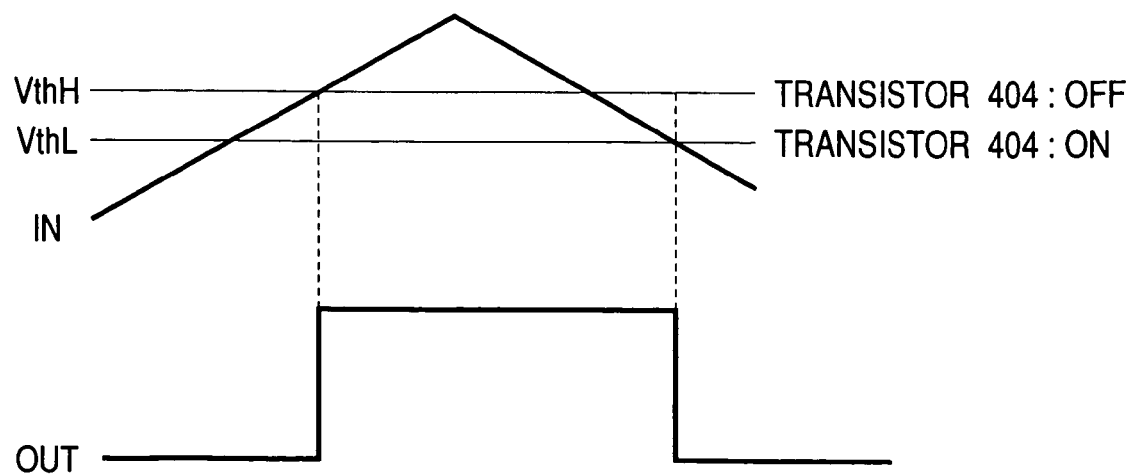
FIG. 7 is an illustration of a hysteresis characteristic of the comparison circuit according to the fourth embodiment.

That is, as shown in FIG. 7, when the transistor 404 turns off, the threshold voltage Vth becomes VthH, and when the transistor 404 turns on, the threshold Vth becomes VthL.

Thus, in the multi-collector transistor having a cell in which two collectors paired are provided with respect to one emitter, through the use of the phenomenon that, when no current flows in one collector, the current flowing in the other collector increases, a hysteresis develops therein.

As mentioned above, the comparison circuit comprises threshold voltage generating means for generating a threshold voltage Vth by means of the resistance division between the resistors 401 and 407) and the comparator 405 for making a comparison between an input signal inputted through an input terminal and the threshold voltage Vth, and further comprises a transistor 404 which turns on/off in accordance with a comparison result in the comparator 405, and a multi-collector transistor 406 whose first collector is connected to the junction between the resistors 401, 407 and second collector is connected to the transistor 404 so that a current is supplied through the first collector to the resistor 407 and a current is supplied through the second collector to the transistor 404 and which is made to, when the supply of the current through the second collector to the transistor 404 comes to a stop, increase the current flowing through the first collector to the resistor 407. This provides a new arrangement as a comparison circuit developing a hysteresis.

OTHER EMBODIMENTS

Although in the above-described first embodiment the transistor 101 is constructed as a multi-collector transistor having four collectors 1 to 4, it is also appropriate that a multi-collector transistor having collectors 1 and 2 and a transistor having a collector 3 are provided and the bases of the respective transistors are connected to each other. Moreover, it is also appropriate that, as the transistor 101 according to the second embodiment, a multi-collector transistor having collectors 2 and 3 and a transistor having a collector 1 are provided and the bases of the respective transistors are connected to each other.

Still moreover, although the current supply circuit is equipped with the multi-collector transistor 101, other arrangements are also acceptable provided that, when difficulty is encountered in supplying the current I2, one of the current I3 and the current I1 increases while the other does not vary.

It should be understood that the present invention is not limited to the above-described embodiments, and that it is intended to cover all changes and modifications of the embodiments of the invention herein which do not constitute departures from the spirit and scope of the invention.

What is claimed is:

1. An operational amplification circuit comprising a differential amplification circuit and an outputting circuit,
   said differential amplification circuit including:
      a first input-stage transistor circuit to which an input signal is inputted through an inverting input terminal;
      a second input-stage transistor circuit to which an input signal is inputted through a non-inverting input terminal;
      third and fourth transistors connected to said first and second input-stage transistor circuits, respectively, to constitute a current mirror circuit;
      a fifth transistor connected to a junction between said first input-stage transistor circuit and said third transistor;
      a sixth transistor connected to a junction between said second input-stage transistor circuit and said fourth transistor; and
      a current supply circuit for supplying a current to said first and second input-stage transistor circuits and further for supplying a current to said fifth and sixth transistors,
      a current flowing in said sixth transistor being in proportion to the product of a current flowing in said fifth transistor, a ratio of current amplification factors of said third and four transistors and a ratio of current amplification factors of said fifth and sixth transistors,
   said outputting circuit being made to output a low or high logical level on the basis of the relationship between said current to be supplied from said current supply circuit to said sixth transistor and said current flowing in said sixth transistor,
   said current supply circuit being made such that, when the supply of said current to said first and second input-stage transistor circuits comes to a stop, said current to be supplied to one of said fifth and sixth transistors increases while said current to be supplied to the other does not vary.

2. The circuit according to claim 1, wherein said current supply circuit is a multi-collector transistor including a first collector connected to said first and second input-stage transistor circuits, a second collector connected to one of said fifth and sixth transistors and a third collector connected to the other of said fifth and sixth transistors so that, when the supply of a current from said first collector comes to a stop, a portion of a current flowing in its emitter flows in said second collector.

* * * * *